US010288684B2

(12) United States Patent
Gentner et al.

(10) Patent No.: US 10,288,684 B2
(45) Date of Patent: *May 14, 2019

(54) ON-CHIP HARDWARE-CONTROLLED WINDOW STROBING

(71) Applicant: International Business Machines Corporation, Armonk, NY (US)

(72) Inventors: Thomas Gentner, Boeblingen (DE); Daniel Rodko, Poughkeepsie, NY (US); Hagen Schmidt, Tuebingen (DE); Otto A. Torreiter, Leinfelden-Echterdingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/806,666

(22) Filed: Nov. 8, 2017

(65) Prior Publication Data

US 2018/0364309 A1 Dec. 20, 2018

Related U.S. Application Data

(63) Continuation of application No. 15/625,495, filed on Jun. 16, 2017.

(51) Int. Cl.
G01R 31/28 (2006.01)
G01R 31/3185 (2006.01)
G01R 31/317 (2006.01)
G01R 31/3187 (2006.01)

(52) U.S. Cl.
CPC . *G01R 31/318552* (2013.01); *G01R 31/3187* (2013.01); *G01R 31/31727* (2013.01)

(58) Field of Classification Search
CPC ...... G01R 31/318552; G01R 31/31727; G01R 31/3187; G01R 31/3177; G01R 31/31813; G01R 31/318547; G01R 31/31703; G01R 31/31932; G11C 29/40; G11C 2029/3602; G11C 29/08; G11C 29/12015; G11C 29/56012; G11C 29/14; G11C 2029/0405; H04L 49/9057; H04L 47/34; H01L 2224/16225; H01L 2224/48091
See application file for complete search history.

(56) References Cited

PUBLICATIONS

List of IBM Patents or Patent Applications Treated as Related; (Appendix P), Filed Nov. 8, 2017; 2 pages.
Thomas Gentner et al., "On-Chip Hardware-Controlled Window Strobing", U.S. Appl. No. 15/625,495, filed Jun. 16, 2017.

*Primary Examiner* — Guerrier Merant
(74) *Attorney, Agent, or Firm* — Cantor Colburn LLP; Margaret McNamara

(57) ABSTRACT

An integrated circuit with a hardware-based controller enables a system for a set of clock cycles and selectively enables an aspect of the system for a subset of the set of clock cycles. The controller includes a clock cycle select circuit to output a test select signal that indicates the subset of the set of clock cycles during which to enable the aspect of the system, and a test start circuit to receive the test select signal and output a test signal to the system to enable the system for the set of clock cycles. The controller also includes an AND gate to output a gated signal to enable the aspect of the system for the subset of the set of clock cycles based on the test select signal.

9 Claims, 8 Drawing Sheets

ON-CHIP HARDWARE-CONTROLLED WINDOW STROBING

DOMESTIC PRIORITY

This application is a continuation of U.S. application Ser. No. 15/625,495 filed Jun. 16, 2017, the disclosure of which is incorporated herein by reference in its entirety.

BACKGROUND

The present invention relates to on-chip testing, and more specifically, to on-chip hardware-controlled window strobing.

In an integrated circuit or chip, different components are triggered by clock signals. One example of a component that is triggered by a clock signal is a built-in self-test (BIST) engine. BIST refers to hardware, software, or a combination of the two, which is built into an integrated circuit or chip and used to test the operation of the chip. For example, logic BIST (LBIST) tests the functional logic of the chip, and array BIST (ABIST) tests arrays or memory of the chip. Typically, BIST runs over millions of clock cycles until testing is completed, and tests results are accumulated in a pass or fail format.

SUMMARY

According to an embodiment of the present invention, a hardware-based controller in an integrated circuit enables a system for a set of clock cycles and selectively enables an aspect of the system for a subset of the set of clock cycles. The controller includes a clock cycle select circuit configured to output a test select signal that indicates the subset of the set of clock cycles during which to enable the aspect of the system, and a test start circuit configured to receive the test select signal and output a test signal to the system to enable the system for the set of clock cycles. The controller also includes an AND gate configured to output a gated signal to enable the aspect of the system for the subset of the set of clock cycles based on the test select signal.

According to another embodiment of the present invention, an integrated circuit includes a system, and a hardware-based controller configured to enable the system for a set of clock cycles and selectively enable an aspect of the system for a subset of the set of clock cycles. The controller includes a clock cycle select circuit configured to output a test select signal that indicates the subset of the set of clock cycles during which to enable the aspect of the system, and a test start circuit configured to receive the test select signal and output a test signal to the system to enable the system for the set of clock cycles. The controller also includes an AND gate configured to output a gated signal to enable the aspect of the system for the subset of the set of clock cycles based on the test select signal.

According to yet another embodiment of the invention, a method of fabricating an integrated circuit to control a system in the integrated circuit to be enabled for a set of clock cycles and an aspect of the system to be selectively enabled for a subset of the set of clock cycles includes fabricating a clock cycle select circuit to output a test select signal that indicates the subset of the set of clock cycles during which to enable the aspect of the system. The method also includes fabricating a test start circuit to receive the test select signal and output a test signal to the system to enable the system for the set of clock cycles, and arranging an AND gate to output a gated signal to enable the aspect of the system for the subset of the set of clock cycles based on the test select signal.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As previously noted, components of a chip are triggered by a clock signal. One example that is discussed herein for explanatory purposes is a BIST engine, also referred to as BIST logic. BIST can be used to test different aspects of chip operation. Exemplary self-test engines include ABIST, LBIST, and architecture verification patterns (AVP). These tests are accomplished by functional code loaded into on-chip data and instruction storage. The tests typically run over millions of clock cycles. That is, the control signal that triggers operation of the BIST is held at "1" (i.e., is high) over all the clock cycles of the tests.

Once the tests are completed, test results are provided in an accumulated pass/fail format. For example, the multiple-input signature register (MISR) is used to convert output bits into a signature that can be compared with a fault-free signature to determine a pass or fail condition. A fault address register (FAR) holds the address at which a synchronous abort occurred, and AVP passcount values are obtained. Generally, the BIST state machines store the output in an array and output a signal to a comparator to compare the data in the array with expected data. When a failure occurs during a BIST operation, the accumulated result does not provide insight as to which section of the test sequence resulted in the failure. Thus, a separate control signal to control the comparison portion facilitates selecting particular clock cycles of the self-test for which the data array is compared with expected data or is omitted from the comparison.

In this regard, embodiments of the systems and methods detailed herein relate to on-chip hardware controlled window strobing. That is, the embodiments pertain to controlling a component (e.g., BIST engine) to run for a given number of clock cycles while additionally controlling an aspect of the component (e.g., stored data comparison) to be selectively on or off for a subset of the clock cycles. This selectively turning on and off is referred to as strobing. In the exemplary case of the BIST engine, the strobing is provided by hardware elements that facilitate greater granularity (at the clock cycle level) of the at-speed test result observation or failure analysis. Specifically, one or more clock cycles can be isolated for test result analysis or, if a known fault is to be masked, specific clock cycles can be omitted from test analysis. The testing itself, in terms of the setup or stimulation pattern, need not be modified and, according to some of the embodiments, already available test signal functions may be reused for the strobing to avoid additional circuitry to obtain the additional diagnostic features.

Figure 1:
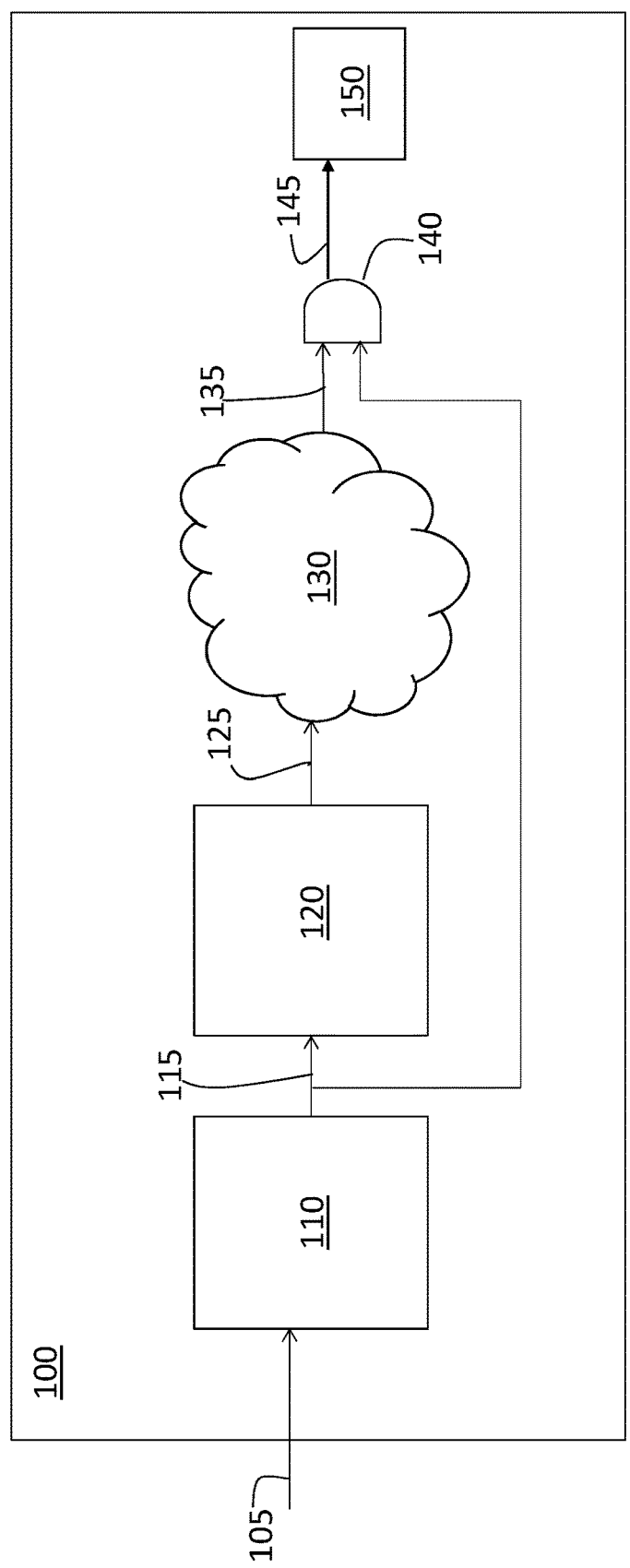
FIG. 1 is a block diagram of an integrated circuit with a system to perform on-chip hardware-controlled window strobing according to one or more embodiments.

FIG. 1 is a block diagram of an integrated circuit 100 with a system to perform on-chip hardware-controlled window strobing according to one or more embodiments. For explanatory purposes, window strobing of output from a BIST engine 130 is discussed with reference to FIG. 1. The BIST engine 130 can perform ABIST or LBIST or implement AVP, for example. As previously noted, the window strobing or enabling at selected clock cycles can be used to drive other components or aspects of components of the integrated circuit 100, as well. The system discussed with reference to FIG. 1 is a hardware-based controller that includes a clock cycle select circuit 110, test start circuit 120, and strobe application AND gate 140.

The clock cycle select circuit 110 can be implemented by different embodiments, as detailed with reference to FIGS. 2-4, and facilitates the window strobing or clock cycle selection. The test start circuit 120 ensures that the component (BIST engine 130 in the exemplary case) is operated as normal despite the strobing of an aspect of the BIST operation and is detailed with reference to FIG. 2. External signals 105 from outside the integrated circuit 100 can be input to the clock cycle select circuit 110 according to one or more embodiments. The clock cycle select circuit 110 provides a test select signal 115 to the test start circuit 120 and also to the aspect controlled by the strobing, which is the comparator 150 in the exemplary case. The test start circuit 120 outputs a test signal 125 to the BIST engine 130 to facilitate normal operation of the BIST engine. The BIST engine 130 outputs a compare enable signal 135, which is controlled by the strobing according to the test select signal 115 and the strobe application AND gate 140. The strobe application AND gate 140 applies the strobing to the compare enable signal 135 to output a gated compare enable signal 145 that ultimately drives the comparator 150 according to the embodiments detailed herein.

Figure 2:
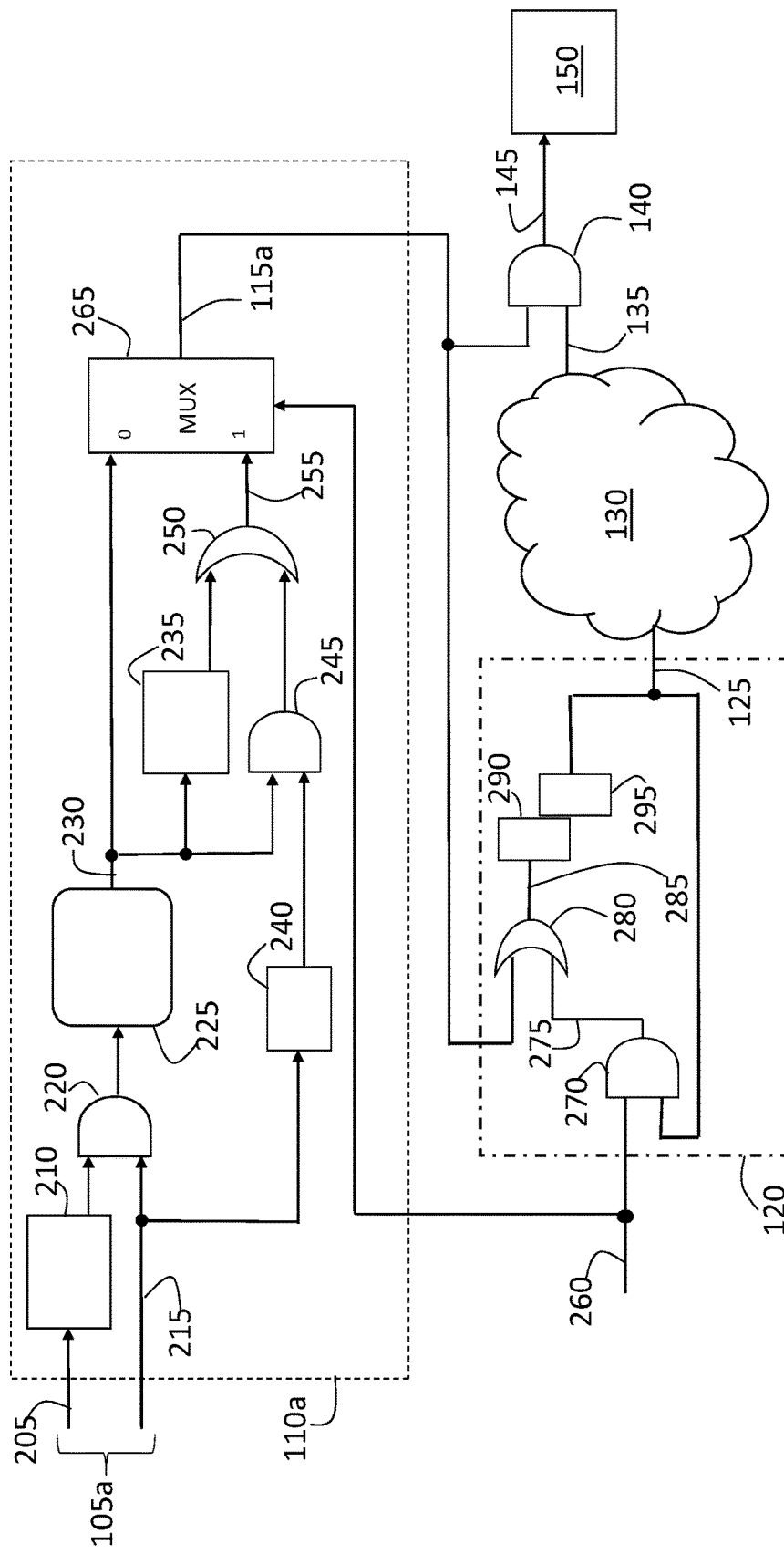
FIG. 2 details the system to perform on-chip hardware-controlled window strobing according to an exemplary embodiment.

FIG. 2 details the system to perform on-chip hardware-controlled window strobing according to an exemplary embodiment. The clock cycle select circuit 110a according to the embodiment shown in FIG. 2 reuses existing clock signals as the external signals 105a from outside the integrated circuit 100. An alternate current (AC) clock signal 205 is supplied to an edge detector 210. The output of the edge detector 210 and a direct current (DC) clock signal 215 are input to an AND gate 220. The output of the AND gate 220 is provided to an on-chip clock generator 225. Thus, the on-chip clock generator 225 only receives a "1" or start signal from the AND gate 220 when both the output of the edge detector 210 of the AC clock signal 205 and the DC clock signal 215 are "1." The on-chip clock generator 225 is the component that enables the BIST engine 130 and maintains its operation throughout the testing. Specifically, the trigger signal 230 output by the on-chip clock generator 225 is "1" for all the clock cycles associated with testing by the BIST engine 130.

The DC clock signal 215 is optionally also provided to latches 240 (e.g., flip flops) that provide a strobe (on/off) signal to AND gate 245. The latches 240 latch to the DC clock signal 215 and are needed for high-speed applications (e.g., on other order of gigahertz (over 5 gigahertz)), for example. The AND gate 245 only outputs a "1" when the trigger signal 230 and the output of the latches 240 are both "1." This AND gate 245 provides the strobe.

As FIG. 2 indicates, the trigger signal 230 is provided to a multiplexer 265 and a rising edge detector 235, in addition to the AND gate 245. The rising edge detector 235, which detects the rising edge of the trigger signal 230, provides output to an OR gate 250. The rising edge detector 235 being "1" indicates that the trigger signal 230 has transitioned to "1," which indicates a start of the BIST engine 130, as discussed with reference to the multiplexer 265.

The rising edge detector 235 output is "0" (i.e., is low) for the remainder of the testing duration. The output of the AND gate 245 is also provided to the OR gate 250. The output of the AND gate 245 is "1" only when both the trigger signal 230 and the output of the latches 240 (i.e., the latched DC clock signal 215) are "1." As previously noted, the trigger signal 230 is "1" for the duration of testing by the BIST engine 130. The latches 240 output the window strobe signal and, thus, the AND gate 245 outputs the window strobe. Because, after the initial transition to "1" of the trigger signal 230 at the start of testing, the edge detector 235 outputs a "0," the OR gate 250 only outputs a "1" when the AND gate 245, which follows the strobing according to the DC input signal 215, is "1."

As previously described, when the AC clock signal 205 goes to "1" to indicate the start of testing, the rising edge detector 235 outputs a "1", thereby making the strobe enable signal 255 output by the OR gate 250 a value of "1" regardless of the DC clock signal 215. This leads to the multiplexer 265 outputting a "1" as the test select signal 115a for the first clock cycle of the testing by the BIST engine 130. That is, the rising edge detector 235 enable the initial value of the test select signal 115a to be "1" based solely on the AC clock signal 205 and regardless of the DC clock signal 215.

After the first clock cycle of testing by the BIST engine 130, the multiplexer 265 receives a "1" as the trigger signal 230 and a "1" or "0" as the strobe enable signal 255. The value of the strobe enable signal 255 is determined by the DC clock signal 215 and, consequently, the AND gate 245 and OR gate 250. Another input to the multiplexer 265 is a strobe override signal 260. The strobe override signal 260 is a control signal that can override the strobe enable signal 255 and is set for the duration of the testing.

When the strobe override signal 260 is "0," the normal operation of the BIST engine 130 is performed. In this case, both the signal provided to the BIST engine 130 (test signal 125) and the signal provided to the comparator 150 (gated compare enable signal 145) being "1" for the duration of testing. When the strobe override signal 260 is "1," then the window selection of clock cycles within the testing duration (the strobe window) is performed according to the DC clock signal 215. In this case, the signal provided to the BIST engine 130 (test signal 125) is "1" for the duration of testing, but the signal provided to the comparator 150 (gated compare enable signal 145) is controlled to be either "1" or "0" based on the DC clock signal 215. The test select signal 115a that is output by the multiplexer 265 is "1" at the start of testing and is then either "1" or "0" according to the strobe window.

The test start circuit 120 receives the test select signal 115a from the clock cycle select circuit 110a and the strobe override signal 260. The test start circuit 120 ensures that the test signal 125 that is provided to the BIST engine 130 remains at "1" for the entire duration of testing. The AND gate 270 receives the strobe override signal 260 and the test select signal 115a. Thus, the output signal 275 of the AND gate 270 is "1" only when the strobing is enabled for the testing duration (i.e., strobe override signal 260 is "1") and the test signal 125 is "1." This output signal 275 and the test select signal 115a are provided to an OR gate 280. The OR gate 280 output 285 will be "1" when the test select signal 115a, the output signal 275, or both are "1."

During the duration of the test, the output 285 will remain "1." This is because either the test select signal 115a will remain at "1" (when the strobe override signal 260 is "0") or the output signal 275 of the AND gate 270 will remain "1" (when the strobe override signal 260 is "1"). The output signal 275 of the AND gate 270 will remain "1" when the strobe override signal 260 is "1" because the initial value of "1" for the test select signal 115a will be held by the latches 290, 295, which are in a master-slave configuration. As a result, the test signal 125 that is fed back to the AND gate 270 will be "1." The result of the strobe override signal 260 and the test signal 125 being "1" is that the output signal 275 of the AND gate 270 will be "1," as well.

As the BIST engine 130 operates, data is stored in memory arrays of the integrated circuit 100. The BIST engine 130 outputs a compare enable signal 135. In a prior system that does not include the strobing function, the compare enable signal 135 is provided directly to the comparator 150 and initiates a comparison of the data stored in the arrays by the BIST engine 130 with expected data for every clock cycle. According to the embodiments of the invention, the compare enable signal 135 of the BIST engine 130 is gated. Specifically, the test select signal 115a and the compare enable signal 135 are input to the strobe application AND gate 140. The compare enable signal 135 is always "1" but, when the strobe override signal 260 is "1" (i.e., window strobing is enabled), the test select signal 115a is either "1" or "0" based on the clock cycles that are of interest. Thus, when the strobe override signal 260 is "1" (i.e., window strobing is enabled), the gated compare enable signal 145 that drives the comparator 150 is either "1" or "0" based on the test select signal 115a. That is, the comparator 150 only compares data saved in the array by the BIST engine 130 when the test select signal 115a, which reflects the value of the DC clock signal 215, is "1."

Figure 3:
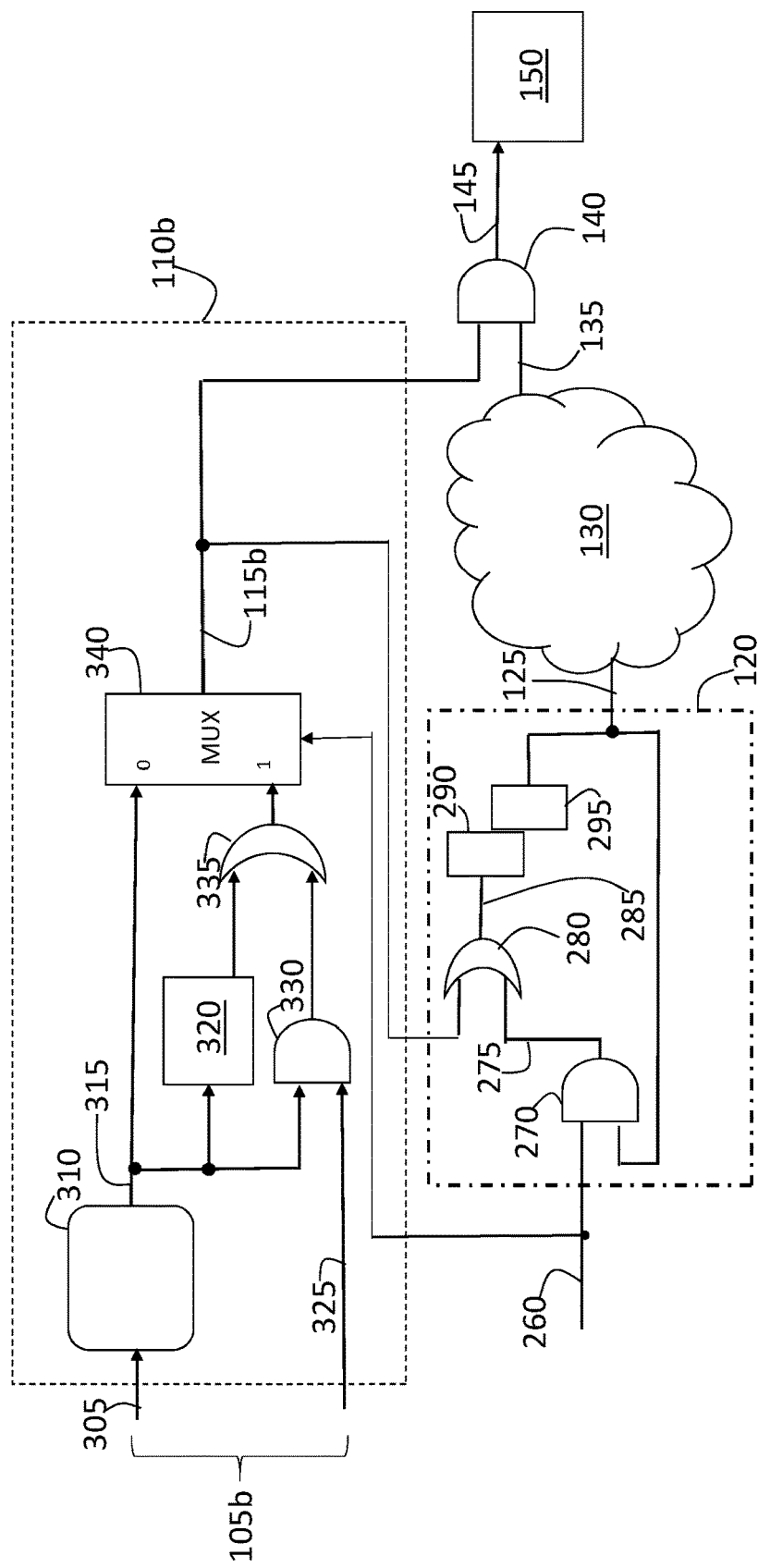
FIG. 3 details the system to perform on-chip hardware-controlled window strobing according to another exemplary embodiment.

FIG. 3 details the system to perform on-chip hardware-controlled window strobing according to another exemplary embodiment. The embodiment shown in FIG. 3 includes a simplified clock cycle select circuit 110b compared with the clock cycle select circuit 110a according to the embodiment shown in FIG. 2. The test start circuit 120 and the operation of the strobe application AND gate 140 are the same for both embodiments. Thus, these components are not described again with reference to FIG. 3. The test start circuit 120 ensures that the test signal 125 provided to the BIST engine 130 is "1" for the duration of the testing. The strobe application AND gate 140 applies the window strobing to the compare enable signal 135 from the BIST engine 130 when the strobe override signal 260 is "1," thereby indicating that window strobing is enabled.

The clock cycle select circuit 110b shown in FIG. 3 does not receive the AC clock signal 205 and DC clock signal 215. As such, the clock cycle select circuit 110b does not include the edge detector 210, AND gate 220, and latches 240 that are shown in FIG. 2. The external signals 105b that are input to the clock cycle select circuit 110b include a start signal 305 and a tester pin input 325. The start signal 305 is provided to an on-chip clock generator 310. The start signal 305 stays at "1" for the duration of testing. As a result, the trigger signal 315 that is output by the on-chip clock generator stays at "1" for the duration of the testing by the BIST engine 130. Like the trigger signal 230 in the clock cycle select circuit 110a shown in FIG. 2, the trigger signal 315 is provided to a multiplexer 340, a rising edge detector 320, and an AND gate 330. The AND gate 330 also receives the tester pin input 325. Like the DC clock signal 215 in the embodiment shown in FIG. 2, the tester pin input 325 is the input of the strobing control.

The rising edge detector 320 outputs a "1" when the trigger signal 315 first goes to "1" but then remains at "0" for the remainder of the testing. After the initial clock cycle, during which the rising edge detector 320 outputs a "1," the output of the OR gate 335, which is provided to the multiplexer 340 along with the trigger signal 315, is only "1" when the output of the AND gate 330 is "1." Because the trigger signal 315 is held at "1," the tester pin input 325 is determinative of the output of the AND gate 330. That is, the AND gate 330 outputs a "1" (thereby making the output of the OR gate 335 a "1") when the tester pin input 325 is "1," and the AND gate 330 outputs a "0" (thereby making the output of the OR gate 335 a "0") when the tester pin input 325 is "0."

Because the initial output of the rising edge detector 320, at the start of testing, is a "1," the initial output of the OR gate 335 is "1." As a consequence, the test select signal 115b, which is output by the multiplexer 340, is "1" when the testing by the BIST engine 130 is initiated. This is true regardless of the tester pin input 325. Subsequently, the test select signal 115b is either "1" or "0" according to the tester pin input 325 when strobing is enabled (i.e., the strobe override signal 260 is "1"). This is because, as in the embodiment shown in FIG. 2, another input to the multiplexer 340 is the strobe override signal 260. Thus, the test select signal 115b follows the tester pin input 325 in the same way that the test select signal 115a follows the DC clock signal 215 in the embodiment of FIG. 2 when strobing is enabled.

As previously noted, the remainder of the circuitry is the same in the embodiment of FIG. 3 as it is in FIG. 2. Accordingly, when the strobe override signal 260 is "0" (i.e., when strobing is disabled during testing), then the test select signal 115b value stays at "1" for the duration of the test, and when the strobe override signal 260 is "1" (i.e., when strobing is enabled), then the test select signal 115b value is either "0" or "1" based on the test select signal 115b. Ultimately, when the strobe override signal 260 is "1," the gated compare enable signal 145 that driver the comparator 150 follows the tester pin input 325. As such, controlling the tester pin input 325 facilitates controlling the clock cycles for which the comparison of BIST engine output data is compared with expected data.

Figure 4:
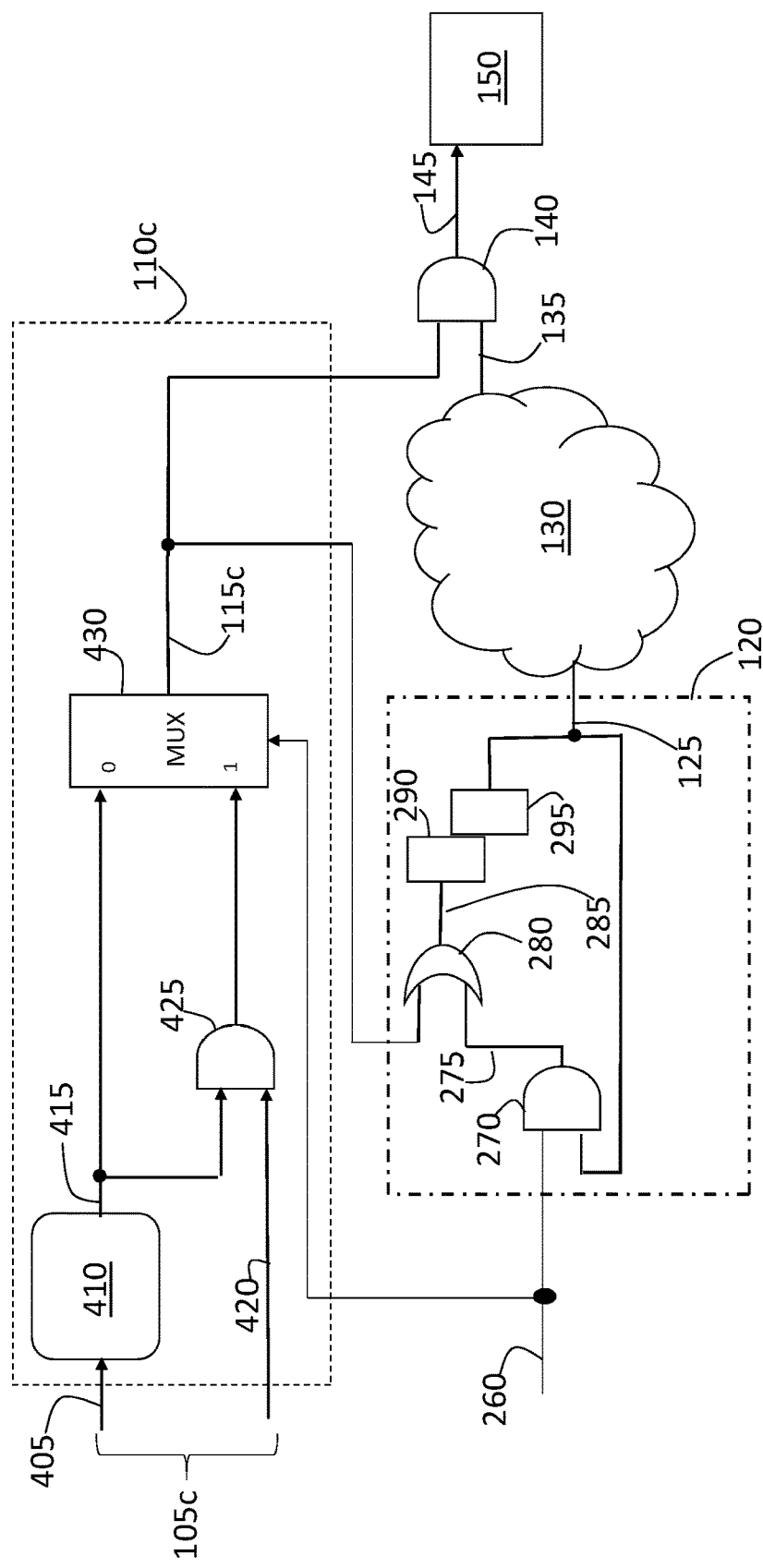
FIG. 4 details the system to perform on-chip hardware-controlled window strobing according to yet another exemplary embodiment.

FIG. 4 details the system to perform on-chip hardware-controlled window strobing according to yet another exemplary embodiment. The embodiment shown in FIG. 4 is further simplified from the embodiment shown in FIG. 3. Specifically, the clock cycle select circuit 110c is simplified in comparison to the clock cycle select circuits 110a and 110b. The test start circuit 120 and the operation of the strobe application AND gate 140 are again the same as in the embodiments described with reference to FIGS. 2 and 3. Thus, these components are not described again with reference to FIG. 4. The test start circuit 120 ensures that the test signal 125 provided to the BIST engine 130 is "1" for the duration of the testing. The strobe application AND gate 140 applies the window strobing to the compare enable signal 135 from the BIST engine 130 when the strobe override signal 260 is "1," thereby indicating that window strobing is enabled.

The external signals 105c that are input to the clock cycle select circuit 110c include a start signal 405 and a tester pin input 420. The start signal 405 is provided to an on-chip clock generator 410. The start signal 405 remains at "1" for the duration of testing. As a result, the trigger signal 415 provided by the on-chip clock generator 410 remains at "1" for the duration of the testing by the BIST engine 130. The clock cycle select circuit 110c shown in FIG. 4 does not include the rising edge detector 235 shown in FIG. 2 or the rising edge detector 320 shown in FIG. 3. As a result, the tester pin input 420 must be "1" when the start signal 405 transitions to "1" in order to start the testing by the BIST engine 130. This is because, even though the trigger signal 415 that is provided to the multiplexer 430 and the AND gate 425 remains at "1" for the duration of testing, the output of the AND gate 425 that is also provided to the multiplexer 430 will only be "1" when the tester pin input 420 is also "1." Thus, for the test select signal 115c output by the multiplexer 430 to initially have the value of "1," the tester pin input 420 must be "1."

Following the first clock cycle of testing, the tester pin input 420 can be selected to control strobing by controlling the value output by the AND gate 425, because the trigger signal 415 value remains at "1." Consequently, when strobing is enabled (the strobe override signal 260 is "1"), the test select signal 115c follows the tester pin input 420. As previously noted, the remainder of the circuitry is the same in the embodiment of FIG. 4 as it is in FIGS. 2 and 3. Accordingly, when the strobe override signal 260 is "0" (i.e., when strobing is disabled during testing), then the test select signal 115c value stays at "1" for the duration of the test, and when the strobe override signal 260 is "1" (i.e., when strobing is enabled), then the test select signal 115c value is either "0" or "1" based on the test select signal 115c. Ultimately, when the strobe override signal 260 is "1," the gated compare enable signal 145 that driver the comparator 150 follows the tester pin input 420. As such, controlling the tester pin input 420 facilitates controlling the clock cycles for which the comparison of BIST engine output data is compared with expected data.

Figure 5:
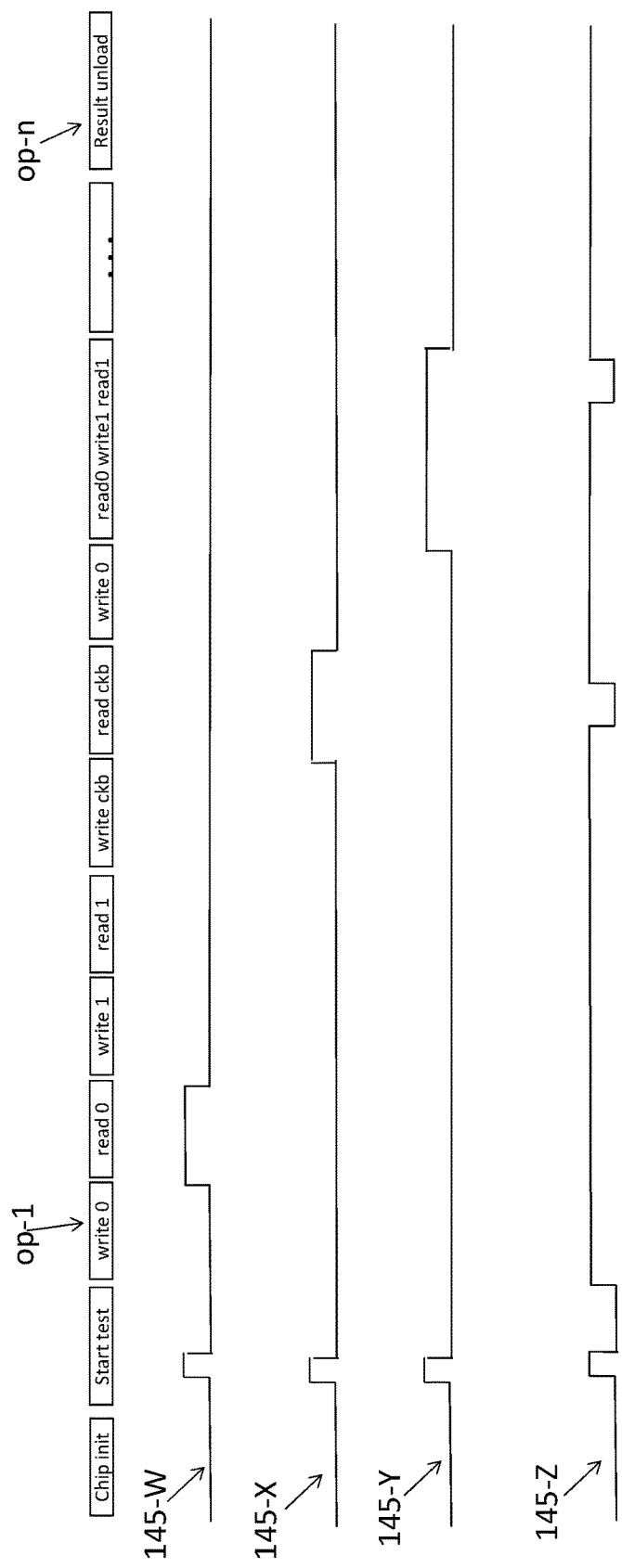
FIG. 5 shows exemplary strobe signals according to one or more embodiments to target or exclude specific clock cycles.

FIG. 5 shows exemplary strobe signals according to one or more embodiments to target or exclude specific clock cycles. The BIST engine 130 is an ABIST in the exemplary case. As such, the exemplary test operations (op-1 through op-n) that are performed by the BIST engine 130 pertain to memory array operations. Four exemplary gated compare enable signals 145-W, 145-X, 145-Y, and 145-Z (referred to collectively as 145) are shown. These gated compare enable signals 145 result from the DC clock signal 215 according to the embodiment shown in FIG. 2, from the tester pin input 325 according to the embodiment shown in FIG. 3, or from the tester pin input 420 according to the embodiment shown in FIG. 4.

All of the gated compare enable signals 145 go to "1" during the start of the test. Thus, even according to the embodiment shown in FIG. 4, which does not include a rising clock edge detector 235, 320, the test select signal 115a, 115b, 115c is "1" to start the testing by the BIST engine 130. The gated compare enable signals 145-W, 145-X, and 145-Y illustrate selective comparisons for a subset of clock cycles (and associated operations), and the gated compare enable signal 145-Z illustrates selection exclusion of a subset of clock cycles (and associated operations) from comparison by the comparator 150.

The gated compare enable signals 145-W and 145-X are only "1" for one clock cycle. As such, a specific check can be accomplished. For example, the gated compare enable signal 145-W is only "1" for the "read 0" operation. Thus, by only checking the data stored by the BIST engine 130 during the "read 0" operation with expected data, a check can be performed of a data=0 weakness (failure). The gated compare enable signal 145-X is only "1" for the "read ckb" operation. Thus, by only checking the data stored by the BIST engine 130 during the "read ckb" operation with expected data, a check can be performed of checkerboard weakness (failure).

The gated compare enable signal 145-Y is "1" for more than one clock cycle. Specifically, the gated compare enable signal 145-Y is "1" for the "read0, write 1, read 1" operation. Thus, by only checking the data stored by the BIST engine 130 during the "read0, write 1, read 1" operation with expected data, a check can be performed for double address fails (fails related to specific address failing to write or read 0 or read 1). Unlike the gated compare enable signals 145-W, 145-X, and 145-Y, which are only "1" for one or two clock cycles, the gated compare enable signal 145-Z is "1" for every clock cycle except the ones associated with the "read ckb" and "read1" operations. This type of gated compare enable signal 145 can be used to exclude a known fail from the comparisons made by the comparator 150. That is, if there were known errors in the "read ckb" and "read1" operations, for example, then the gated compare enable signal 145-Z would result in the comparator 150 indicating a pass, because the known errors are explicitly excluded from being among the comparisons made by the comparator 150.

Figure 6:
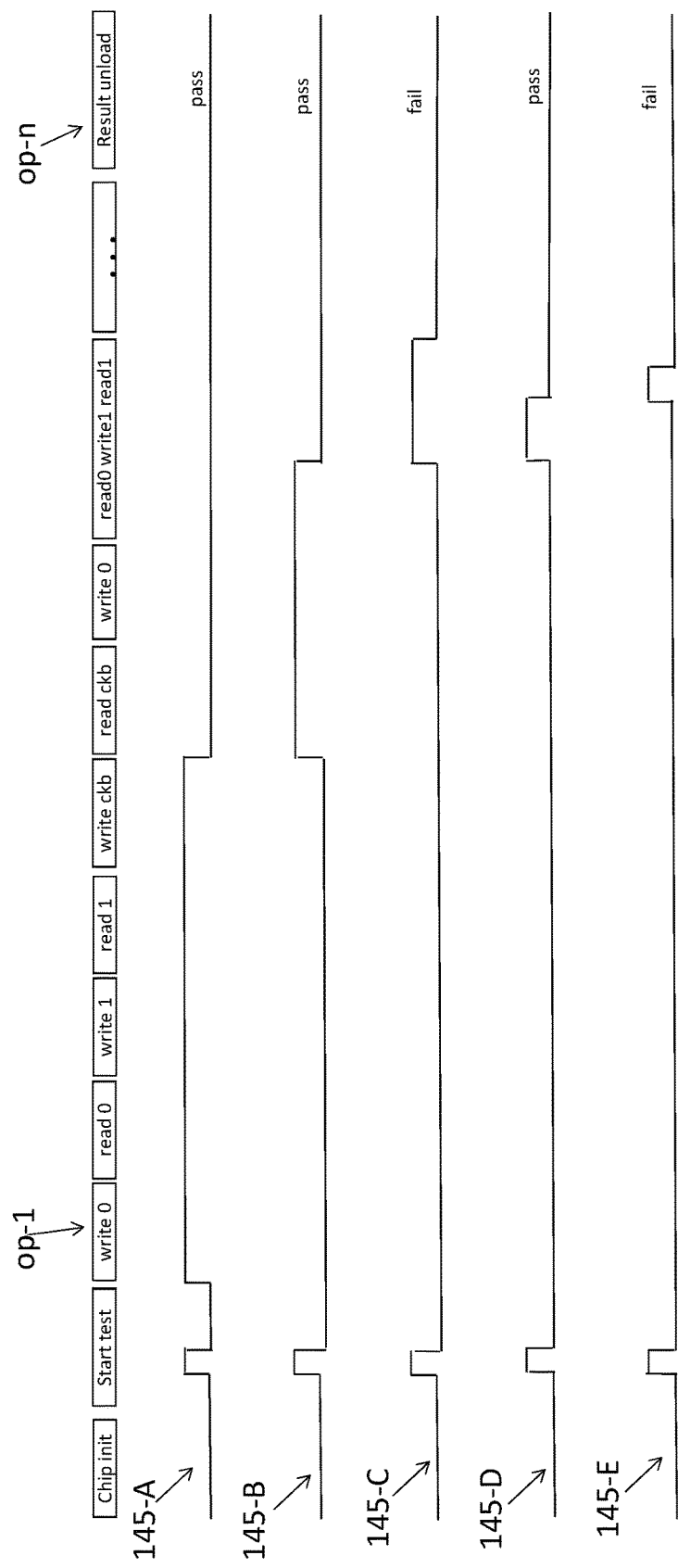
FIG. 6 shows exemplary strobe signals according to one or more embodiments to search for a fail.

FIG. 6 shows exemplary strobe signals according to one or more embodiments to search for a fail. The first fail is identified according to the exemplary tests discussed with reference to FIG. 6. The BIST engine 130 is an ABIST in the exemplary case. As such, the exemplary test operations (op-1 through op-n) that are performed by the BIST engine 130 pertain to memory array operations, as in the exemplary case shown in FIG. 5. A sequence of five exemplary gated compare enable signals 145-A, 145-B, 145-C, 145-D, and 145-E (referred to collectively as 145) are shown. As noted with reference to FIG. 5, these gated compare enable signals 145 result from the DC clock signal 215 according to the embodiment shown in FIG. 2, from the tester pin input 325 according to the embodiment shown in FIG. 3, or from the tester pin input 420 according to the embodiment shown in FIG. 4.

The sequence of gated compare enable signals 145 shown in FIG. 6 facilitate an expeditious approach to finding an operation that fails. First, the gated compare enable signal 145-A is used to compare the results of a first subset of operations with the expected results. As FIG. 6 indicates, this comparison results in a "pass" according to the example. The gated compare enable signal 145-B is then used to compare the results of a subsequent subset of operations with the expected results. As FIG. 6 indicates, this comparison, too, results in a "pass" according to the example. The gated compare enable signal 145-C is then used to compare the results of a subsequent subset of operations, specifically "write1, read1," with the expected results. As FIG. 6 indicates, this comparison results in a "fail" according to the example.

At this stage, to isolate the failure to one of the operations within the subset "write1, read1," the output of each of the operations is compared with expected results individually. That is, the gated compare enable signal 145-D enables a comparison of the results of only the "write1" operation with expected results. As FIG. 6 indicates, this comparison results in a "pass" according to the example. The gated compare enable signal 145-E enables a comparison of the results of only the "read1" operation with expected results. As FIG. 6 indicates, this comparison results in a "fail" according to the example. Thus, using a set of six gated compare enable signals 145, the "read1" operation could be isolated as the first failing operation.

Figure 7:
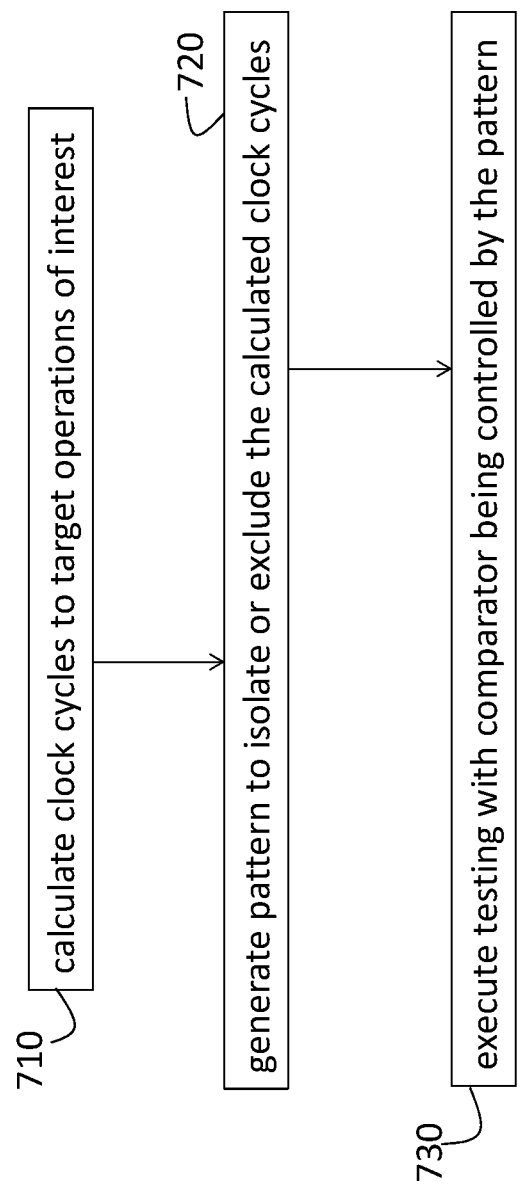
FIG. 7 is a process flow of a method of performing targeted testing according to one or more embodiments.

FIG. 7 is a process flow of a method of performing targeted testing according to one or more embodiments. At block 710, calculating clock cycles to target operations of interest includes identifying the one or more clock cycles associated with the operation or operations to be isolated or excluded. For example, as shown in FIG. 5, the clock cycle associated with the "read 0" operation is determined to generate the gated compare enable signal 145-W. Generating a pattern to isolate or exclude the calculated clock cycles, at block 720, refers to generating the pattern to be issued as the DC clock signal 215 according to the embodiment shown in FIG. 2, the tester pin input 325 according to the embodiment shown in FIG. 3, or the tester pin input 420 according to the embodiment shown in FIG. 4. Executing testing with the comparator 150 being controlled by the pattern, at block 730, refers to the fact that the pattern that is input as the DC clock signal 215 according to the embodiment shown in FIG. 2, the tester pin input 325 according to the embodiment shown in FIG. 3, or the tester pin input 420 according to the embodiment shown in FIG. 4 is that pattern that is ultimately input as the gated compare enable signal 145 to the comparator 150. Once the pattern is determined and used, it can be stored for subsequent testing as needed.

Figure 8:
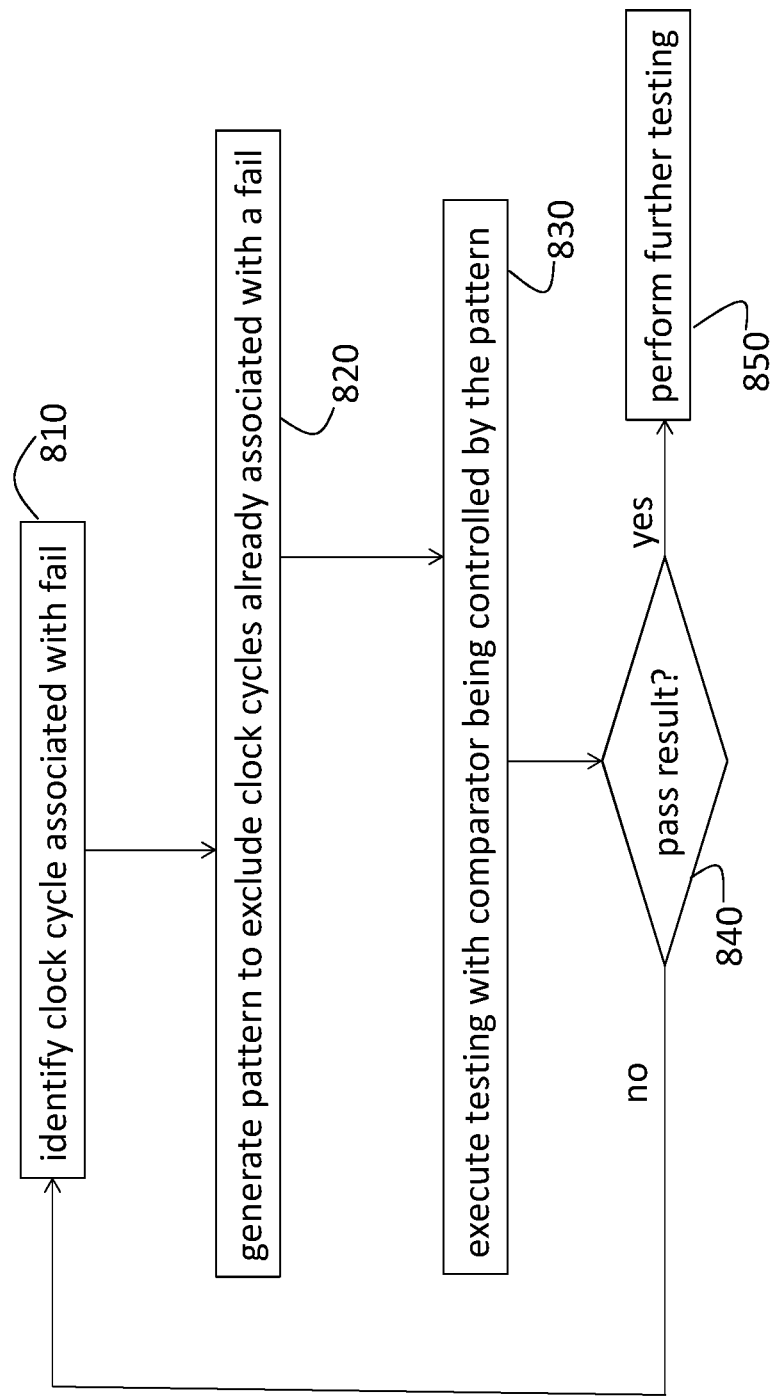
FIG. 8 is a process flow of a method of performing failure identification according to one or more embodiments.

FIG. 8 is a process flow of a method of performing failure identification according to one or more embodiments. At block 810, identifying a clock cycle associated with a fail can include using a sequence of tests, as discussed with reference to FIG. 6 to identify the clock cycle associated with the "read1" operation. Generating a pattern to exclude clock cycles already associated with a fail, at block 820, refers to generating the gated compare enable signal 145 to exclude the clock cycle identified at block 810 for every iteration of the processes. As previously noted, the gated compare enable signal 145 is generated according to a specific pattern based on the DC clock signal 215 according to the embodiment shown in FIG. 2, the tester pin input 325 according to the embodiment shown in FIG. 3, or the tester pin input 420 according to the embodiment shown in FIG. 4 being generated according to the specific pattern. Executing testing with the comparator 150 being controlled by the pattern, at block 830, refers to the comparator 150 comparing results stored by the BIST engine 130 with expected results according to the pattern defined by the gated compare enable signal 145.

At block 840, a check is done of whether the testing outputs a pass result based on all the known fails being excluded from comparison by the comparator 150. If the remainder (non-excluded portion) of the BIST engine 130 output does not match expected results (i.e., the result of the check is no), then another iteration of processes 810 through 840 is performed. If the remainder (non-excluded portion) of the BIST engine 130 output does match expected results (i.e., the result of the check is yes), then performing further testing, at block 850, can refer to several options. The pattern that excludes all the clock cycles associated with fails can be stored for use in subsequent testing. According to an alternate embodiment, a comparison for each of the operations associated with a fail can be run in isolation, according to the discussion with reference to FIG. 5, to further analyze the failing operation by changing test conditions, for example.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating an integrated circuit to control a system in the integrated circuit to be enabled for a set of clock cycles and an aspect of the system to be selectively enabled for a subset of the set of clock cycles, the method comprising:

fabricating a clock cycle select circuit to output a test select signal that indicates the subset of the set of clock cycles during which to enable the aspect of the system;

fabricating a test start circuit to receive the test select signal and output a test signal to the system to enable the system for the set of clock cycles; and arranging an AND gate to output a gated signal to enable the aspect of the system for the subset of the set of clock cycles based on the test select signal.

2. The method according to claim 1, further comprising arranging a multiplexer as part of the clock cycle select circuit, wherein the multiplexer is configured to output the test select signal.

3. The method according to claim 2, further comprising arranging an on-chip clock generator as part of the clock cycle select circuit, wherein the on-chip clock generator is configured to receive a clock signal from outside the integrated circuit and output a trigger signal to the multiplexer that remains high for the set of clock cycles.

4. The method according to claim 2, further comprising arranging an OR gate as part of the clock cycle select circuit, wherein the OR gate is configured to output a strobe-enable signal to the multiplexer that is high only for the subset of the set of clock cycles.

5. The method according to claim 4, further comprising coupling a strobe signal from outside the integrated circuit to provide input to the clock cycle select circuit, wherein the OR gate is controlled by the strobe signal and the strobe-enable signal output of the OR gate is configured to be high only when the strobe signal is high.

6. The method according to claim 2, further comprising coupling a strobe override signal to provide input to the clock cycle select circuit and the test start circuit, wherein the multiplexer is configured to receive the strobe override signal and output the test select signal that is high for the set of the clock cycles when the strobe override signal is low.

7. The method according to claim 1, further comprising arranging a set of latches as part of the test start circuit, wherein the set of latches is configured to output the test signal to the system that is high for the set of clock cycles.

8. The method according to claim 1, wherein enabling the system includes enabling a built-in self-test (BIST) for the set of clock cycles.

9. The method according to claim 8, wherein enabling the aspect of the system includes enabling a comparator configured to compare data output by the BIST for the subset of the set of clock cycles respectively with expected data.

* * * * *